United States Patent [19]

Chan

[11] Patent Number: 5,978,197
[45] Date of Patent: Nov. 2, 1999

[54] TESTING ESD PROTECTION SCHEMES IN SEMICONDUCTOR INTEGRATED CIRCUITS

[75] Inventor: Victer Chan, San Jose, Calif.

[73] Assignee: LSI Corporation, Milpitas, Calif.

[21] Appl. No.: 08/972,231

[22] Filed: Nov. 18, 1997

[51] Int. Cl.$^6$ .................................................. H02H 3/22
[52] U.S. Cl. ............................. 361/111; 361/56; 324/686; 324/713
[58] Field of Search ............................. 361/56, 111, 91.1; 324/537, 686, 713, 719

[56] References Cited

U.S. PATENT DOCUMENTS

| | | | |
|---|---|---|---|
| 5,410,254 | 4/1995 | Consiglio | 324/456 |
| 5,523,699 | 6/1996 | Miyagawa | 324/765 |
| 5,786,700 | 7/1998 | Jen et al. | 324/713 |

*Primary Examiner*—Michael J. Sherry

[57] ABSTRACT

Circuitry for testing and comparing ESD protection structures is provided on a semiconductor integrated circuit. Analysis of charge transmitted to a test capacitor on board the chip provides for improved accuracy in evaluating performance of the ESD protection structure. Moreover, multiple ESD structures can be implemented and accurately compared to one another on a test chip as described. The disclosed methods and apparatus are usefull in reduced turn-around time and more accurate evaluation and comparison of ESD protection structures in integrated circuits.

20 Claims, 2 Drawing Sheets

TESTING ESD PROTECTION SCHEMES IN SEMICONDUCTOR INTEGRATED CIRCUITS

The present invention is related to ESD protection in integrated circuits and, more specifically, methods and apparatus for testing and comparing alternative ESD protection schemes.

BACKGROUND OF THE INVENTION

Semiconductor integrated circuits are quickly destroyed when subjected to excessive voltages. One of the most common causes of damage is electrostatic discharge or ESD. An ESD event occurs whenever a packaged IC is subjected to the dissipation of static electricity, which may occur whenever the pins of the IC come into contact with another surface. Thus, the likelihood of an ESD event damaging or destroying an IC is substantial during packaging and handling of the IC. Even after an integrated circuit is mounted on a circuit board and housed within a system, such as a modem or PC, it is nonetheless susceptible to ESD events discharging in and around the circuitry.

The human body is a major source of static charge. It is sometimes modeled as a 100 picofarad capacitor, capable of storing two or three kilovolts and having a series resistance on the order of a few K-ohms. Thus, when the pins of a packaged integrated circuit are touched by a person, a peak current on the order of two amperes can be delivered through the MOS devices on the IC. These voltages and currents can easily damage or destroy the gate oxides of modem MOS devices on the IC which have sub-micron geometries. To address this problem, most ICs are provided with some sort of ESD protection scheme.

Frequently, ESD protection schemes comprise one or more diodes or SCR circuits coupled between each input/output (I/O) pad on the chip, and the power supply rails. When an excessive voltage appears at the corresponding pin, for example an ESD event, the diode, SCR or similar circuitry turns on very quickly, to short the high voltage to the power supply node. For example, U.S. Pat. Nos. 4,829,350; 4,811,155; 4,855,620; and 4,692,834 all disclose ESD protection circuits in which the channel of an MOS device is coupled between ground and a pin of the IC. Such an MOS device has a parasitic bipolar transistor coupled in parallel with the MOS device. When a positive ESD event occurs at the pin, the bipolar transistor is forward-activated, and a substantial portion of the ESD current is passed through it to ground. An electrostatic discharge protection circuit having a non-lightly doped drain MOS device for protecting other lightly doped drain devices is disclosed in U.S. Pat. No. 5,246,872. A method for forming a silicon-controlled rectifier (SCR) in a semiconductor integrated circuit is described in U.S. Pat. No. 5,369,041. Another CMOS on-chip ESD protection circuit and related semiconductor structure are shown in U.S. Pat. No. 5,182,220.

What is lacking, however, is a means for meaningfully comparing these various protection schemes and their effectiveness relative to a given semiconductor process. In other words, there are no standards for comparing the effectiveness of various alternative ESD protection structures or designs. In the prior art, a semiconductor manufacturer implements an ESD protection scheme onto a product design. The product design goes through the usual floor planning, placement, routing, and other design steps which are well-known in the semiconductor industry. After the design is completed, the circuit is fabricated according to the manufacturer's standard process, and then samples devices are tested. Typically, they are first tested to insure functionality, and then they are submitted for ESD testing or "zapping." The devices are subjected to various ESD zap voltages (for example at 1 kV, 1.5 kV and 2 kV) and various power and ground configurations. The core functionality is confirmed once again after the zapping is completed. The highest zap voltage for which the core maintained functionality post-ESD zap are reported as the ESD voltage performance of the product.

This prior art methodology has several disadvantages. First, in the prior art methodologies, the ESD circuits are connected to the chip internal circuits or "core." Often, manufacturing variations in the core and the core circuitry itself can affect the results of the ESD protection testing. Second, these tests are not very accurate because of the granularity of the ESD testing voltages. Finer variations in ESD test voltages might be applied, but that approach severely impacts testing time. A third disadvantage of the prior art is that feedback on ESD structure design is very slow because the typical design, manufacturing and testing cycle often takes 15–20 weeks. Each iteration required to test an alternative protection scheme is very time consuming and expensive.

SUMMARY OF THE INVENTION

Accordingly, the need remains for improvements in methods and apparatus for testing and comparing ESD protection schemes in integrated circuits. One object of the present invention is to provide a standardized method for comparing different ESD protection schemes so that the comparisons are meaningful.

Another object of the invention is to improve the accuracy of ESD effectiveness testing.

A further object of the invention is to reduce the development time in connection with ESD protection.

According to one aspect of the invention, a method of evaluating an ESD protection structure formed in a semiconductor integrated circuit (IC) is described. The ESD protection structure is connected to an I/O node adjacent to a corresponding I/O pad for shunting current from the I/O node when an electrostatic-discharge voltage is applied to an external pin wired to the said I/O pad, as in the prior art. The new testing method calls for providing a capacitor connected at its first terminal to the I/O node, and connected at its second terminal to a first measurement pad. The capacitor is located on a core side of the ESD protection structure so that the ESD protection structure is connected to the I/O node generally in between the I/O pad and the capacitor. The method steps further include connecting the capacitor first terminal to a second measurement pad; subjecting the I/O pad to an electrostatic-discharge voltage; and then determining a charge stored on the capacitor in order to evaluate efficacy of the ESD protection structure. In one preferred embodiment, the charge on the capacitor is evaluated by first isolating the capacitor from the ESD structures, and then measuring the capacitor through pins connected for that purpose.

Another aspect of the invention extends this basic concept to provide for comparison of multiple ESD protection schemes. The comparison is meaningful because the various ESD schemes are implemented on the same chip using a single process. Thus, their relative performance is attributable to the ESD design, rather than to process variations, core circuitry effects or other uncontrolled variables. A similar testing capacitor is provided for each ESD circuit.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
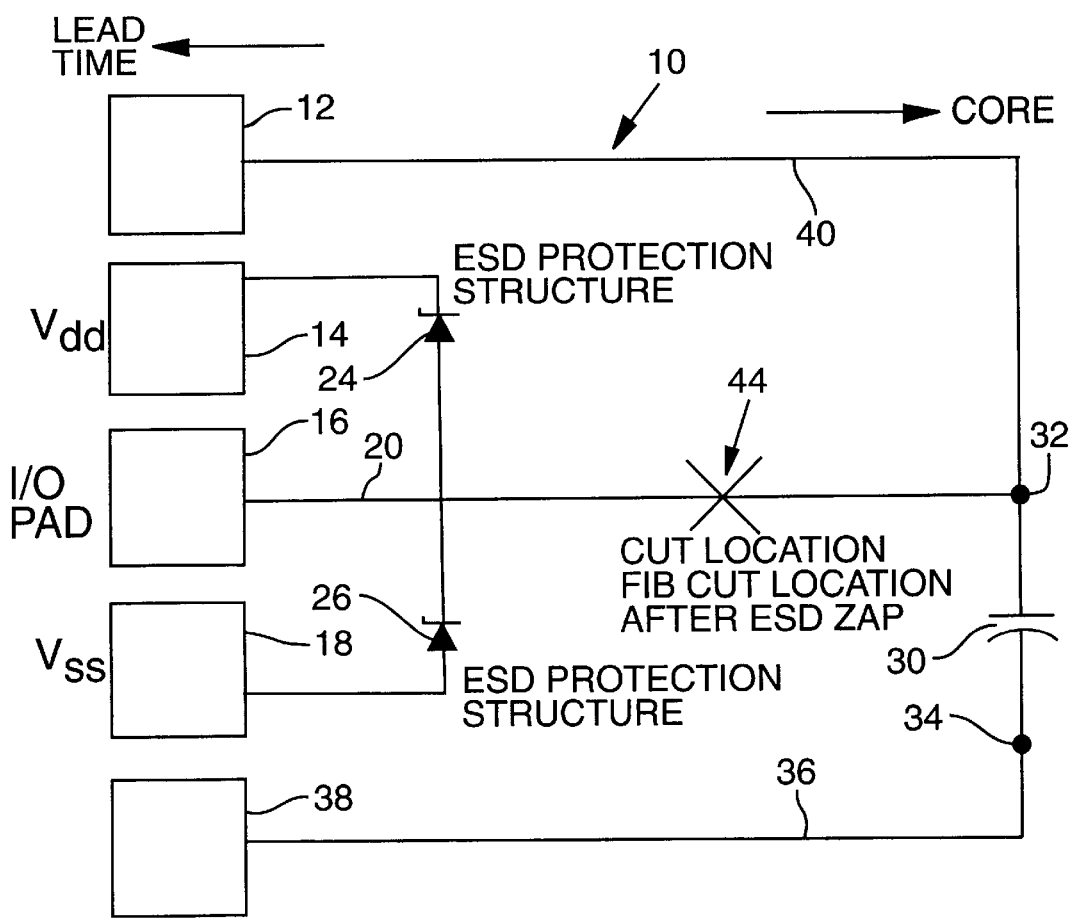
FIG. 1 is an enlarged, simplified diagram illustrating a peripheral region of a semiconductor integrated circuit including ESD protection structure testing apparatus according to the present invention.

In FIG. 1, a peripheral portion of a semiconductor integrated circuit chip 10 is shown for illustrating the invention. In the figure, a series of bonding pads or I/O pads are shown, for example I/O pads 12, 14 and 16. An I/O node 20 comprising a metal or other conductive material is connected to I/O pad 16. A first electrostatic discharge ("ESD") protection structure 24 is connected between the I/O node 20 and I/O pad 14. In use, the I/O pad 14 will be connected to a power supply source, Vdd. A second ESD structure 26 is connected between the I/O node 20 and another I/O pad 18. In use, I/O pad 18 will be connected to a second power supply node having a voltage lower than Vdd, for example, Vss or ground. In general, the ESD protection structures are implemented physically close to the I/O pads on the chip. In this view, which is essentially a top-plan view of a peripheral portion of the chip, the bonding wires and lead frame (not shown) would be to the left in the drawing, while the center or core of the chip would be to the right. The particular type of ESD protection structure is not important to the present invention. Although ESD protection structures 24, 26 are illustrated as diodes, this is merely for simplicity in this description. As described in the Background, the ESD protection structures can take the form of one or more diodes, or SCR circuitry, or a combination of bipolar transistors, etc.

A capacitor 30 is formed on the chip for testing performance of the ESD structures as further explained below. The capacitor 30 has two terminals. A first terminal 32 of capacitor 30 is connected to the I/O node 20. The second terminal 34 of capacitor 30 is connected via path 36 to another I/O pad 38, which we will also refer to as a measurement pad. It is important that the capacitor be positioned on the core side of the ESD protection structure so that the ESD protection structures 24, 26 are connected to the I/O node 20 generally in between the corresponding I/O pad 16 and the capacitor 30. In this way, the capacitor can be used to measure current or charge that gets past the ESD structures toward the core circuitry. A first terminal 32 of the capacitor also is connected via conductor 40 to the I/O pad 12—also called a measurement pad. Thus it can be observed that the first and second measurement pads 38, 12 provide for external connections across the capacitor 30. A cut location 44 is selected along the I/O node 20 intermediate the ESD protection structures and the capacitor 30. When the I/O node 20 is cut at such a location, so as to break the electrical connection between the ESD protection structures and the capacitor, the capacitor is isolated from the ESD protection structures (and the I/O pad 16), but it can be accessed via the measurement pads as noted. This allows testing and measuring the capacitor without influence from the ESD protection structures.

Operation

A structure of the type described above is formed on an integrated circuit for the purpose of evaluating one or more ESD protection structures formed on the same chip as described. The chip is fabricated and packaged in the usual manner. It need not include any other circuitry in the core of the chip for present purposes. If the chip is built with core circuits on board, the core circuitry preferably is disconnected from the I/O pads illustrated in FIG. 1, so that the core circuitry does not influence performance of the ESD protection structures or the capacitor 30.

After packaging, an electrostatic discharge event is simulated by applying a high voltage source to the I/O pad 16, via the corresponding external pin on the package. This is conveniently provided by commercially-available test equipment, for example the KeyTek tester. It provides connections for 512 pins and can simulate both human body ESD modeling and machine modeling. After the ESD event (sometimes called "zapping"), performance of the ESD structures can be evaluated by determining an indication of the quantum of charge that passed through the I/O node past the ESD structure(s) to the capacitor 30.

After the zapping event, the packaging is opened (decapped), so as to expose the top surface (metallization) of the integrated circuit chip 30. The I/O node 20 conductor is cut at a selected location 44, as mentioned above, so as to isolate the capacitor 30 from the ESD structures. The trace 20 can be cut by any convenient means, for example a focused ion beam, or other suitable form of electromagnetic radiation applied in a beam small enough to avoid damaging other circuitry, while providing sufficient energy to open the conductor 20. Next, test equipment is connected via I/O pads 12 and 38 to the capacitor 30 for evaluation.

Figure 2:
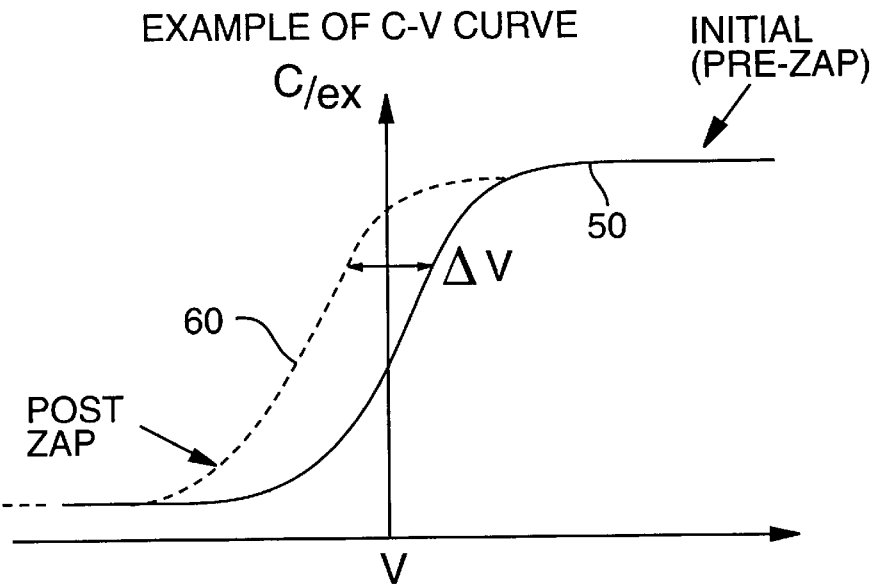
FIG. 2 is a capacitance-voltage (CV) plot useful for determining an amount of charge passing through a capacitor.

Referring now to FIG. 2, a "C-V" or capacitance-voltage curve is shown by way of illustration. This is a generic curve to illustrate the principles involved. Specific voltages and capacitances will depend upon the particular IC technology, feature size, etc. For typical 0.35 or 0.25 micron CMOS technology of the type commonly used today, the nominal capacitance will be on the order of 1 picofarad. In FIG. 2, two curves are shown on the C-V plot. A first generally S-shaped curve 50, shown as a solid line, illustrates the C-V characteristics of a capacitor 30 prior to the ESD zapping procedure. This information can be obtain, for example, by building multiple capacitors on the same chip, and leaving at least one of them "unzapped" i.e., connected to an I/O node which is not subjected to the ESD event. Alternatively, the C-V characteristic of the capacitor 30 could simply be measured before the zapping event, provided that the effect of the ESD structures on those measurements is taken into account (since the cap is still connected to the ESD structure). The second curve in FIG. 2, indicated by dashed line 60, shows a capacitor characteristic as measured after the ESD event. The voltage shift, $\Delta V$ provides an indication of the amount of charge that passed through the capacitor according to the following formulae: $\Delta Q_{fix} = K \times C \times \Delta V$ where K is the percentage of charge captured by damaged oxide in the silicon-oxide structure.

Figure 3:
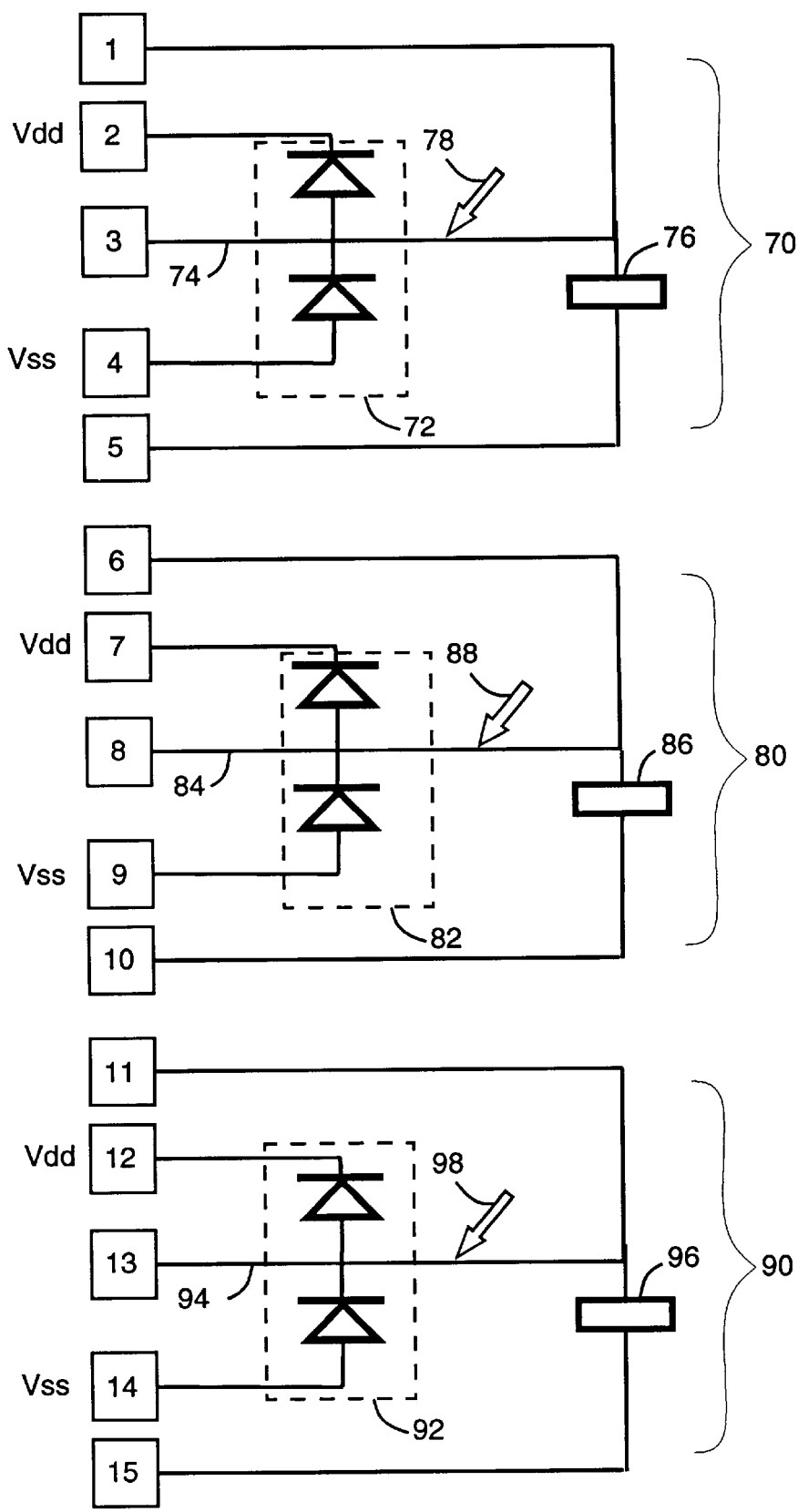
FIG. 3 is an enlarged, simplified diagram illustrating implementation of multiple ESD protection structures on a single semiconductor integrated circuit for comparing performance among the ESD protection structures.

FIG. 3 illustrates another aspect of the invention which is useful for meaningfully comparing performance among multiple ESD protection structures. While the precise performance characteristics of a particular ESD structure may be difficult to quantify, it is nonetheless useful to compare performance of one ESD structure versus another. In prior art, as noted above, this might have been done only in a rough way, by comparing different ESD survival voltages. FIG. 3, according to the present invention, illustrates building multiple ESD protection structures on a single chip, a providing test capacitors for each of them, to enable a more direct comparison of the performance. This provides for more accurate comparison. For example, in the prior art, only a rough indication of the ESD voltage survived has been used. Here, the amount of charge passing through the test capacitor provides more accurate information. By building multiple test structures on a single chip, and using similar capacitors, meaningful comparisons can be made.

Thus, in FIG. 3, a first test circuit is connected to I/O pads 1–5. This circuit is essentially the same as that described previously with reference to FIG. 1. It shows ESD protection structures coupled between an I/O node and power supply terminals. In FIG. 3, three separate ESD protections scheme test circuits are implemented on the same integrated circuit chip. For example, test circuit 70 is associated with I/O pads 1–5. It includes ESD protection circuitry indicated by dashed line 72, coupled to an I/O node 74. A capacitor 76 is provided as described previously with reference to FIG. 1. In operation, an ESD zapping voltage is applied to pad 3 to simulate an ESD event. Next the I/O node trace is cut as indicated by the arrow at 78, and then the capacitor 76 is evaluated via measurement pads 1 and 5.

A second, similar test circuit 80 comprises ESD protection circuitry 82 connected to I/O node 84 and to a test capacitor 86 as described previously. In this case, efficacy of the protection structures 82 can be evaluated after cutting open the trace 84 at a selected location indicated by 88 by measuring the capacitor 86 via I/O pads 6 and 10. Although the ESD protection structure 82 may be the same as the ESD structure 72, this aspect of the invention is especially useful for comparing the performance of various different ESD structures. Similarly, a third test circuit 90 is illustrated as comprising a third ESD protection structure 92 coupled to a third I/O node 94 and capacitor 96. In FIG. 3, I/O pads 2, 7, 12, etc., are connected to Vdd, while I/O pads 4, 9, 14, etc., are connected to Vss or ground. This arrangement is particularly convenient for some integrated circuit technologies in which every fifth I/O pad is connected to Vdd an every fifth I/O pad is connected to Vss. The power supply bonding pads are simply wired to common power supply planes.

In view of the size of modern large-scale integrated circuits, and the hundreds of I/O pads available for connection, it will be appreciated that many, even scores of different ESD protection structures can be built and tested on a single integrated circuit chip using the present invention. This approach very much speeds the ESD protection development process, because it avoids numerous iterations of the design-layout-fabrication cycle to investigate various ESD protection structures. Additionally, the ESD evaluation and comparison from one structure to another is more accurate using the invention because the various protection structures are formed at the same time on a single integrated circuit chip. Similarly, because the test capacitors are formed on a single chip using the same process, they can be made to be extremely consistent from one capacitor to the next. Finally, as alluded to previously, evaluation and comparison is far more accurate over prior art techniques because of the finer resolution in evaluating charge in the test capacitor, rather than the very course granularity of varying ESD voltages. The invention is applicable to virtually all semiconductor integrated circuit technologies.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method of evaluating an ESD protection structure formed in a semiconductor integrated circuit (IC), the ESD protection structure being connected to an I/O node adjacent to a corresponding I/O pad for shunting current from the I/O node when an electrostatic-discharge voltage is applied to an external pin wired to the said I/O pad, the method comprising the steps of:

in the integrated circuit, providing a capacitor connected at its first terminal to the I/O node, and connected at its second terminal to a first measurement pad;

wherein said providing the capacitor includes positioning the capacitor on a core side of the ESD protection structure so that the ESD protection structure is connected to the I/O node generally in between the I/O pad and the capacitor;

connecting the capacitor first terminal to a second measurement pad;

subjecting the I/O pad to an electrostatic-discharge voltage; and then determining a charge stored on the capacitor in order to evaluate efficacy of the ESD protection structure.

2. A method according to claim 1 wherein said subjecting the I/O pad to an electrostatic-discharge voltage comprises shipping the IC to a customer for installation and use in a product; and said determining the charge stored on the capacitor includes first retrieving the IC.

3. A method according to claim 1 wherein said subjecting the I/O pad to an electrostatic-discharge voltage comprises providing an ESD tester and coupling the I/O pad to the ESD tester to receive a selected high-voltage discharge.

4. A method according to claim 3 wherein said providing a capacitor includes forming a silicon-oxide capacitor structure on the semiconductor integrated circuit.

5. A method according to claim 1 wherein the step of determining a charge on the capacitor includes:

isolating the capacitor from the ESD protection structure; and then measuring the charge stored on the capacitor by accessing the capacitor via the first and second measurement pads.

6. A method according to claim 5 wherein measuring the charge includes obtaining a C-V capacitance to voltage scan of the capacitor.

7. A method according to claim 5 wherein said isolating step includes disconnecting the capacitor first terminal from the I/O node at a selected location in between the capacitor and the ESD protection structure.

8. A method according to claim 7 wherein said disconnecting step includes first decapping the IC and then applying selected electromagnetic radiation to the IC so as to cut the I/O node conductor trace in between the capacitor and the ESD protection structure.

9. A method according to claim 8 wherein said applying electromagnetic radiation includes application of a focused ion beam directed at the selected location.

10. A method of comparing performance among more than one ESD protection structures comprising the steps of:

forming a first ESD protection structure in a semiconductor integrated circuit (IC), the ESD protection structure being connected to a first I/O node adjacent to a corresponding first I/O pad for shunting current from the first I/O node when an electrostatic-discharge voltage is applied to an external pin wired to the first I/O pad;

in the integrated circuit, providing a first capacitor connected at its first terminal to the first I/O node, and connected at its second terminal to a first measurement pad;

positioning the first capacitor on a core side of the first ESD protection structure so that the first ESD protection structure is connected to the first I/O node generally in between the first I/O pad and the first capacitor;

forming a second ESD protection structure in the same IC; the second ESD protection structure being connected to a second I/O node adjacent to a corresponding second I/O pad for shunting current from the second I/O node when an electrostatic-discharge voltage is applied to an external pin wired to the second I/O pad;

providing a second capacitor in the IC, the second capacitor connected at its first terminal to the second I/O node, and connected at its second terminal to a second selected measurement pad;

positioning the second capacitor on a core side of the second ESD protection structure so that the second ESD protection structure is connected to the second I/O node generally in between the second I/O pad and the second capacitor;

subjecting the first I/O pad to a selected electrostatic-discharge voltage;

subjecting the second I/O pad to the selected electrostatic-discharge voltage;

determining a first charge stored on the first capacitor;

determining a second charge stored on the second capacitor;

comparing the first and second charges in order to compare the performance of the first and second ESD protection structures.

11. A method according to claim 10 further comprising isolating both the first and second I/O nodes from all internal core circuitry on the IC.

12. A method according to claim 10 wherein the steps of determining the first and second charges each includes:

disconnecting the corresponding capacitor from the corresponding I/O node; and then measuring capacitance versus voltage on the corresponding capacitor to obtain an indication of the corresponding charge.

13. A method according to claim 12 wherein said measuring step includes connecting each capacitor to one or more bonding pads for accessing the capacitor via respective external pins other than the corresponding I/O pins.

14. A method according to claim 12 wherein the first and second capacitors are substantially identically formed on the IC.

15. A method according to claim 12 wherein the first and second capacitors comprise silicon-oxide and have nominal capacitances in the order of magnitude of one picofarad.

16. A semiconductor integrated circuit (IC) for testing and comparing ESD protection structures, the IC comprising:

a first I/O pad;

a first I/O node connected to the I/O pad;

a first ESD protection structure connected to the first I/O node;

a first capacitor connected at its first terminal to the first I/O node and positioned on a core side of the first ESD protection structure so that the first ESD protection structure is connected to the first I/O node generally in between the first I/O pad and the first capacitor;

a first test pad connected to the first terminal of the first capacitor; and a second test pad connected to the second terminal of the first capacitor, so that the first and second test pads provide access across the first capacitor after disconnection of the first terminal of the first capacitor from the first I/O node.

17. A semiconductor integrated circuit according to claim 16 wherein the I/O node includes a length of conductive material interconnecting the first ESD protection structure and the first capacitor, said conductive material including a first target site for cutting the conductive material so as to isolate the first capacitor from the first ESD protection structure.

18. A semiconductor integrated circuit (IC) according to claim 16 and further comprising:

a second I/O pad;

a second I/O node connected to the second I/O pad;

a second ESD protection structure connected to the second I/O node;

a second capacitor connected at its first terminal to the second I/O node and positioned on a core side of the second ESD protection structure so that the second ESD protection structure is connected to the second I/O node generally in between the second I/O pad and the second capacitor;

a third test pad connected to the first terminal of the second capacitor; and a fourth test pad connected to the second terminal of the second capacitor, so that the third and fourth test pads provide access across the second capacitor after disconnection of the first terminal of the second capacitor from the second I/O node.

19. A semiconductor integrated circuit according to claim 18 wherein the first and second capacitors are formed of silicon-oxide materials.

20. A semiconductor integrated circuit according to claim 18 wherein the first and second capacitors are substantially identical so as to support direct comparison of performance of the first and second ESD protection structures.

* * * * *